United States Patent [19]
Nishigori et al.

[11] Patent Number: 5,846,678
[45] Date of Patent: Dec. 8, 1998

[54] EXPOSURE APPARATUS AND DEVICE MANUFACTURING METHOD

[75] Inventors: Hidetoshi Nishigori; Naoto Sano, both of Utsunomiya, Japan

[73] Assignee: Canon Kabushiki Kaisha, Tokyo, Japan

[21] Appl. No.: 576,694

[22] Filed: Dec. 21, 1995

[30] Foreign Application Priority Data

Dec. 22, 1994  [JP]  Japan .................................. 6-320042

[51] Int. Cl.$^6$ .............................. G03F 7/20; G03B 27/72
[52] U.S. Cl. .............................. 430/30; 430/397; 355/69; 355/77
[58] Field of Search .................. 430/30, 397; 355/67, 355/69, 77

[56] References Cited

U.S. PATENT DOCUMENTS

| | | | |
|---|---|---|---|
| 3,823,318 | 7/1974 | Krause | 250/214 P |
| 4,519,692 | 5/1985 | Michalik | 354/412 |
| 4,711,568 | 12/1987 | Torigoe et al. | 355/68 |
| 4,804,978 | 2/1989 | Tracy | 346/108 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 350/6.6 |
| 5,053,614 | 10/1991 | Yui et al. | 250/205 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |
| 5,475,491 | 12/1995 | Shiozawa | 356/394 |
| 5,491,534 | 2/1996 | Shiozawa | 355/69 |
| 5,591,958 | 1/1997 | Nishi | 250/205 |

FOREIGN PATENT DOCUMENTS 61-97830  5/1986  Japan .

*Primary Examiner*—John A. McPherson
*Attorney, Agent, or Firm*—Fitzpatrick, Cella, Harper & Scinto

[57] ABSTRACT

An exposure apparatus for transferring, by exposure, a pattern of a mask onto a wafer, includes a pulse light source and a scanning system for relatively and scanningly moving the mask and the wafer relative to an illumination region to be defined by pulses of light to be sequentially provided by the pulse light source, wherein the number of pulses for exposure of the wafer is determined on the basis of information representing a relation between the pulse number and exposure non-uniformness, and wherein the pulse number is expressed by $L/\Delta X$ where L is the width of the illumination region in a scan direction and $\Delta X$ is the amount of relative displacement of the illumination region moving in the light emission interval of one pulse.

8 Claims, 10 Drawing Sheets

EXPOSURE APPARATUS AND DEVICE MANUFACTURING METHOD

FIELD OF THE INVENTION AND RELATED ART

This invention relates to an exposure apparatus suitably usable for the manufacture of devices such as semiconductor devices (e.g., ICs or LSIs), liquid crystal devices, CCDs or magnetic heads, for example. In another aspect, the invention is concerned with a device manufacturing method for manufacturing microdevices such as described above.

With further increases in the degree of integration of a semiconductor chip, the size of the chip becomes larger and the pattern within the chip becomes more and more minute. In the field of exposure apparatuses to be used for printing such a pattern, a scan type exposure apparatus has been proposed, in which apparatus a fine pattern is printed while an article, to be exposed, is moved to thereby enlarge the exposure range.

Currently proposed scan type exposure apparatuses mainly use a continuous emission type light source such as a high pressure Hg lamp, for example. Since the pattern resolution is proportional to the wavelength of illumination light, use of a light source which provides light in the deep ultraviolet region, of shorter wavelength, has been desired. While light from a Hg lamp in the deep ultraviolet region may be used, it is not easy to obtain an output sufficient for use in an exposure apparatus. On the other hand, a sufficient output of short wavelength light in the deep ultraviolet region may be provided by an excimer laser, and use of the same has been considered effective.

On an occasion when a scanning exposure process is to be performed with an exposure apparatus having, as a light source, an excimer laser which is a pulse emission laser, in order to attain a target integration exposure amount, the scan speed should be determined so that the article, to be exposed, is irradiated with pulse light by times corresponding to the target integration exposure amount.

In a case when the exposure process is performed with pulses of light each having a rectangular intensity distribution with respect to the scan direction and when the exposure width by one pulse in the scan direction corresponds to the product of M×N (M is the movement amount per pulse and N is an integer), every exposure zone is irradiated with the same number of light pulses. Thus, there does not occur non-uniformness in exposure. However, if the exposure process is performed with a scan speed which does not satisfy the above-mentioned relation, overlapping occurs at the pulse light boundary. This causes exposure non-uniformness of a quantity corresponding to one light pulse. Such non-uniformness corresponding to one pulse might be disregarded if the number of pulses to be used for the exposure is large. However, if the exposure pulse number is made smaller for enhanced throughput, the exposure non-uniformness corresponding to one pulse substantively influences the integrated exposure amount.

SUMMARY OF THE INVENTION

It is an object of the present invention to provide a scanning exposure apparatus using a pulse emission type light source such as an excimer laser, for example, by which apparatus non-uniformness of exposure is reduced.

It is another object of the present invention to provide a device manufacturing method for manufacturing microdevices precisely.

In accordance with an aspect of the present invention, there is provided an exposure apparatus for transferring, by exposure, a pattern of a mask onto a wafer, said apparatus comprising: a pulse light source; and scanning means for relatively and scanningly moving the mask and the wafer relative to an illumination region to be defined by pulses of light to be sequentially provided by said pulse light source; wherein the number of pulses for exposure of the wafer is determined on the basis of information representing a relation between the pulse number and exposure non-uniformness; and wherein the pulse number is expressed by $L/\Delta X$ where $L$ is the width of the illumination region in a scan direction and $\Delta X$ is the amount of relative displacement of the illumination region moving in the light emission interval of one pulse.

In one preferred form of this aspect of the present invention, the apparatus may further comprise measuring means for measuring a light intensity distribution in the illumination region with respect to the scan direction, wherein the information may be changeable with the light intensity distribution.

In another preferred form of this aspect of the present invention, the exposure non-uniformness may be represented by a function of the pulse number.

In a further preferred form of this aspect of the present invention, the apparatus may further comprise first adjusting means for adjusting the relative scan speed of the mask and the wafer, by which the pulse number may be determined.

In a further preferred form of this aspect of the present invention, the apparatus may further comprise second adjusting means for adjusting the light emission interval of said pulse light source, by which the pulse number may be determined.

In a further preferred form of this aspect of the present invention, the apparatus may further comprise third adjusting means for adjusting the light intensity distribution in the illumination region with respect to the scan direction, by which the pulse number may be determined.

In a further preferred form of this aspect of the present invention, the light intensity distribution in the illumination region with respect to the scan direction may have a non-rectangular shape.

In a further preferred form of this aspect of the present Invention, the light intensity distribution in the illumination region with respect to the scan direction may have one of a regular trapezoidal shape (with slants of the same length) and a shape similar to a regular trapezoidal shape, and wherein during the exposure operation a relation $L_2=(2N-1)\times L_1$ may be satisfied, where N is a natural number, $L_2$ is the width of a flat portion of the light intensity distribution and $L_1$ is the width of one of the portions in which the light intensity distribution changes.

In a further preferred form of this aspect of the present invention, a relation $L_1:L_2=1:3$ may be satisfied.

In a further preferred form of this aspect of the present invention, said pulse light source may comprise an excimer laser.

In accordance with another aspect of the present invention, there is provided an exposure apparatus for transferring, by exposure, a pattern of a mask onto a water, said apparatus comprising: a pulse light source; scanning means for relatively and scanningly moving the mask and the wafer relative to an illumination region to be defined by pulses of light to be sequentially provided by said pulse light source; and calculating means for producing information representing a relation between the number of pulses and exposure non-uniformness; wherein the number of pulses for exposure of the wafer is determined on the basis of the information produced by said calculating means; and wherein the pulse number is expressed by L/ΔX where L is the width of the illumination region in a scan direction and ΔX is the amount of relative displacement of the illumination region moving in the light emission interval of one pulse.

In one preferred form of this aspect of the present invention, the apparatus may further comprise measuring means for measuring a light intensity distribution in the illumination region with respect to the scan direction, wherein the information may be changeable with the light intensity distribution.

In another preferred form of this aspect of the present invention, the exposure non-uniformness may be represented by a function of the pulse number.

In a further preferred form of this aspect of the present invention, the apparatus may further comprise first adjusting means for adjusting the relative scan speed of the mask and the wafer, by which the pulse number may be determined.

In a further preferred form of this aspect of the present invention, the apparatus may further comprise second adjusting means for adjusting the light omission interval of said pulse light source, by which the pulse number may be determined.

In a further preferred form of this aspect of the present invention, the apparatus may further comprise third adjusting means for adjusting the light intensity distribution in the illumination region with respect to the scan direction, by which the pulse number may be determined.

In a further preferred form of this aspect of the present invention, the light intensity distribution in the illumination region with respect to the scan direction may have a non-rectangular shape.

In a further preferred form of this aspect of the present invention, the light intensity distribution in the illumination region with respect to the scan direction may have one of a regular trapezoidal shape (with slants of the same length) and a shape similar to a regular trapezoidal shape, and wherein during the exposure operation a relation $L_2=(2N-1) \times L_1$ may be satisfied, where N is a natural number, $L_2$ is the width of a flat portion of the light intensity distribution and $L_1$ is the width of one of the portions in which the light intensity distribution changes.

In a further preferred form of this aspect of the present invention, a relation $L_1:L_2=1:3$ may be satisfied.

In a further preferred form of this aspect of the present invention, said pulse light source may comprise an excimer laser In accordance with a further aspect of the present invention, there is provided a device manufacturing method wherein a mask having a pattern is illuminated with sequentially provided pulses of light while the mask and a wafer are relatively and scanningly moved relative to an illumination region defined by the pulse light so that the illumination region is relatively shifted by which the pattern of the mask is transferred to the wafer, said method comprising the steps of: determining information representing a relation between the number of pulses and exposure non-uniformness; and determining the number of pulses on the basis of the information so that the exposure non-uniformness comes into a tolerable range; wherein the pulse number is expressed by L/ΔX where L is the width of the illumination region in a scan direction and ΔX is the amount of relative displacement of the illumination region moving in the light emission interval of one pulse.

In one preferred form of this aspect of the present invention, the method may further comprise measuring a light intensity distribution in the illumination region with respect to the scan direction, wherein the information may be changeable with the light intensity distribution.

In another preferred form of this aspect of the present invention, the exposure non-uniformness may be represented by a function of the pulse number.

In a further preferred form of this aspect of the present invention, the method may further comprise adjusting the relative scan speed of the mask and the wafer, by which the pulse number may be determined.

In a further preferred form of this aspect of the present invention, the method may further comprise adjusting the light emission interval of the pulse light source, by which the pulse number may be determined.

In a further preferred form of this aspect of the present invention, the method may further comprise adjusting the light intensity distribution in the illumination region with respect to the scan direction, by which the pulse number may be determined.

In a further preferred form of this aspect of the present invention, the light intensity distribution in the illumination region with respect to the scan direction may have a non-rectangular shape.

In a further preferred form of this aspect of the present invention, the light intensity distribution in the illumination region with respect to the scan direction may have one of a regular trapezoidal shape (with slants of the same length) and a shape similar to a regular trapezoidal shape, and wherein during the exposure operation a relation $L_2=(2N-1) \times L_1$ may be satisfied, where N is a natural number, $L_2$ is the width of a flat portion of the light intensity distribution and $L_1$ is the width of one of the portions in which the light intensity distribution changes.

In a further preferred form of this aspect of the present invention, a relation $L_1:L_2=1:3$ may be satisfied.

In a further preferred form of this aspect of the present invention, the pulse light may comprise an excimer laser.

In accordance with an exposure apparatus or a device manufacturing method of the present invention, it is assured to produce precise microdevices such as semiconductor devices (e.g., ICs or LSIs), liquid crystal devices, image pickup devices (e.g., CCDs) or magnetic heads, for example.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
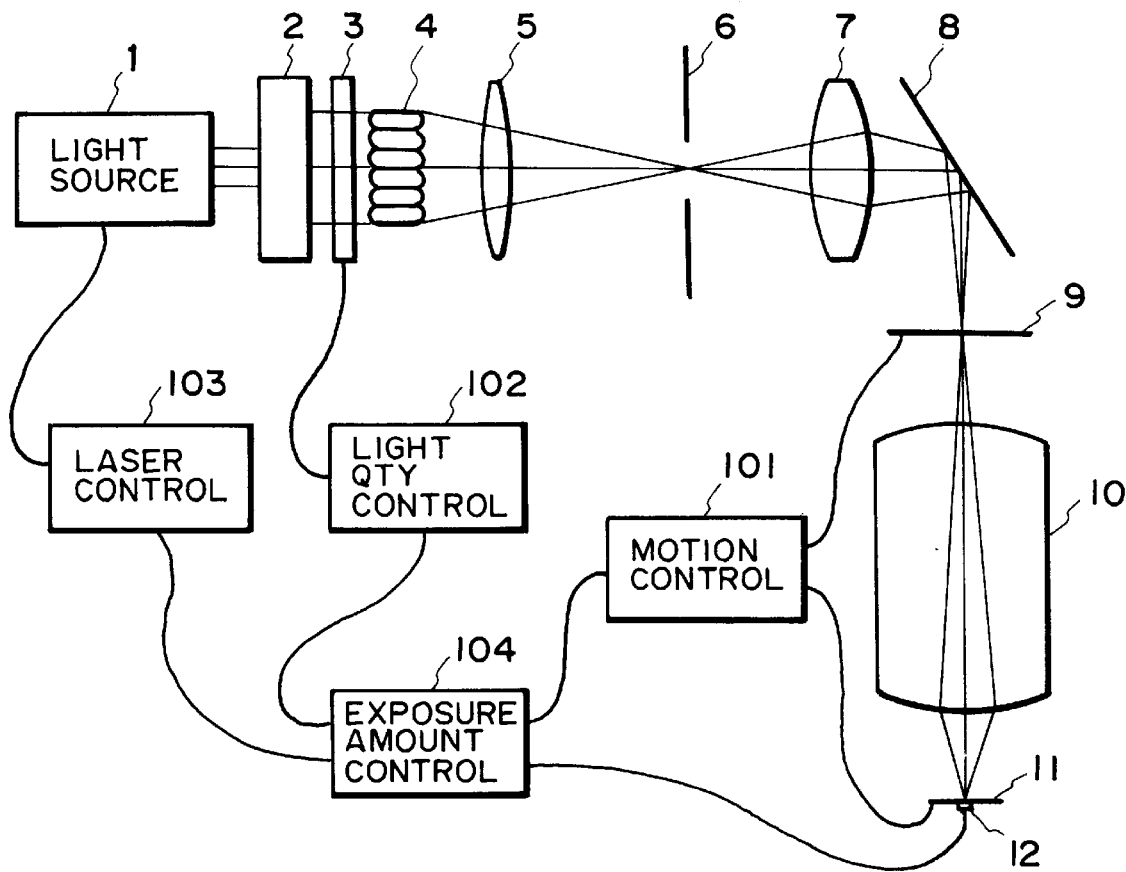
FIG. 1 is a schematic view of an exposure apparatus according to an embodiment of the present invention.

FIG. 1 is a schematic view of an embodiment of the present invention which is applied to a scan type projection exposure apparatus.

In FIG. 1, pulse light from a pulse light source 1 such as an excimer laser, for example, is shaped into a desired shape by a beam shaping optical system 2. Variable ND filter 3 serves to adjust the light quantity of the pulse light. The light from the filter 3 is directed to the light entrance surface of an optical integrator 4, such as a fly's eye lens. The fly's eye lens comprises a combination of small lenses, and it defines a plurality of secondary light sources in the vicinity of the light exit surface of the integrator. The variable ND filter 3 may be disposed between the light source 1 and the beam shaping optical system 2.

Denoted at 5 is a condenser lens which serves to perform Koehler illumination of a masking blade 6 with light from the secondary light sources of the optical integrator 4. The masking blade 6 and a reticle 9 are disposed in an optically conjugate relation with each other, with respect to an imaging lens 7 and a mirror 8. In accordance with the shape and size of the opening of the masking blade 6, the shape and size of the illumination region upon the reticle to be provided by the pulse light is determined. The masking blade 6 has light blocking plates which are movable in the direction of the optical axis and in a direction perpendicular to the optical axis, such that the shape and size of the illumination region upon the reticle 9 surface can be changed.

Denoted at 10 is a projection optical system for projecting, in a reduced scale, a circuit pattern of a reticle 9 onto a wafer 11 coated with a photosensitive material. Denoted at 101 is a motion controlling system for moving, through a driving mechanism (not shown), the reticle 9 and the wafer 11 accurately at a constant speed and with the same ratio as the projection magnification of the projection optical system 10. Denoted at 102 is a light quantity controlling system. It serves to adjust the transmissivity of the variable ND filter 3 in accordance with a target integration exposure amount. Laser controlling system 103 serves to control the emission light quantity and emission frequency of the light source 1.

Light intensity distribution in the exposure region upon the wafer 11, per pulse, is measured by an intensity distribution measuring sensor 12 which is mounted on a movable stage for holding the wafer 11. The sensor 12 may comprise line sensor means arrayed along the scan direction of the wafer 11, or photosensor means which is able to scan in the scan direction of the wafer 11. The sensor 12 is so disposed that the light receiving surface thereof is placed substantially at the same level as the image plane of the reticle 9 as defined by the projection optical system 10.

Denoted at 104 is an exposure amount controlling system. It serves to detect the intensity distribution in the exposure region per one pulse, from the result of measurement made by the intensity distribution measuring sensor 12. Also, it serves to calculate the relation between the exposure non-uniformness and the number of pulses, on the basis of the detected intensity distribution. Further, the exposure amount controlling system is operable, in association with the stage drive controlling system 101, the light quantity controlling system 102 and the laser controlling system 103, to perform setting and controlling of conditions such as stage scan speed, pulse light quantity and pulse emission frequency, for attaining a target exposure amount.

Here, the term "number of pulses" refers to a value which is obtainable by dividing the width L of the pulse light in the scan direction by a relative displacement $\Delta X$, per pulse, of the illumination region (exposure region) of the pulse light, and it represents an average number of pulses projected to the region of a width L when the pulse light of a width L In the scan direction is taken as one pulse. Thus, the "number of pulses" is not always an integral number.

As regards the measurement of the intensity distribution in the exposure region, it may be carried out by actually performing an exposure process to a test wafer and by measuring the result. On that occasion, the intensity distribution of the exposure region may be inputted to the exposure amount controlling system 104 manually by an operator.

Figure 2:
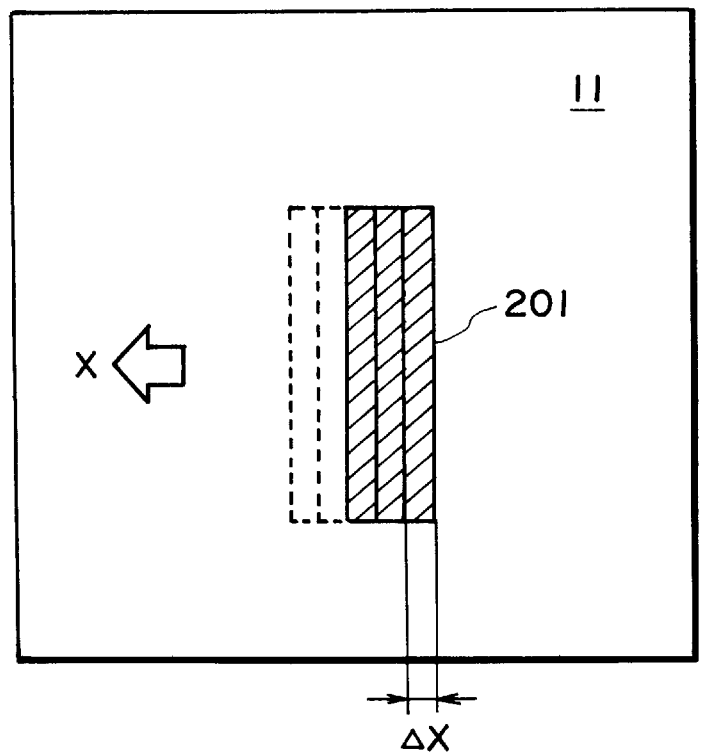
FIG. 2 is a schematic view for explaining a wafer and an illumination region.

The light passing through the masking blade 6 reflects, upon the surface to be exposed, the shape (oblong shape in this embodiment) of the opening of the masking blade 6. FIG. 2 illustrates the process in which, while moving the reticle 9 and the wafer 11 along the minor (widthwise) direction of the oblong shape of the exposure regions the water 11 is sequentially exposed with light pulses from the light source 1. Here, hatched area 201 depicts the exposure region per pulse. Also, the movement speed of the wafer 11, in this example, is m times the movement speed of the reticle 9, where m is equal to the magnification of the projection optical system 10. The shape of the masking blade 6 is not limited to oblong. Any other shape may be used.

As the pulse light is projected intermittently to the wafer 11 while the wafer 11 is moved in the X direction continuously, the exposure region 11 displaces by $\Delta X$ per pulse as shown in FIG. 2, such that there occurs an integration of the exposure amount. If the emission period of pulse light is T and the movement speed of the wafer 11 is V, it follows that:

$$\Delta X = V \times T.$$

Figure 3:
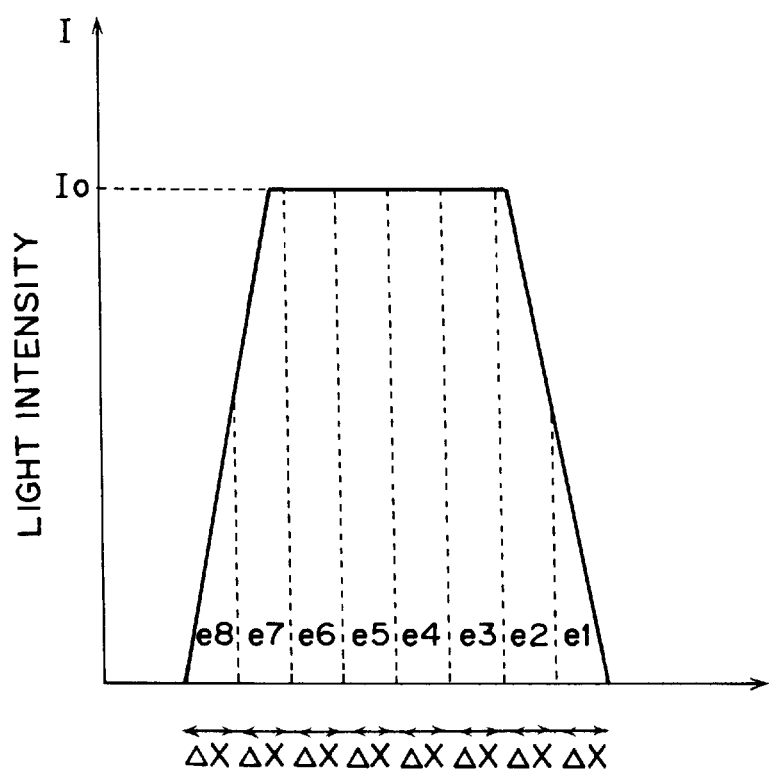
FIG. 3 is a graph for explaining the amount of exposure in relation to displacement, per pulse, of pulse light having an intensity distribution of a symmetrical trapezoidal shape with respect to the scan direction.
Figure 4:
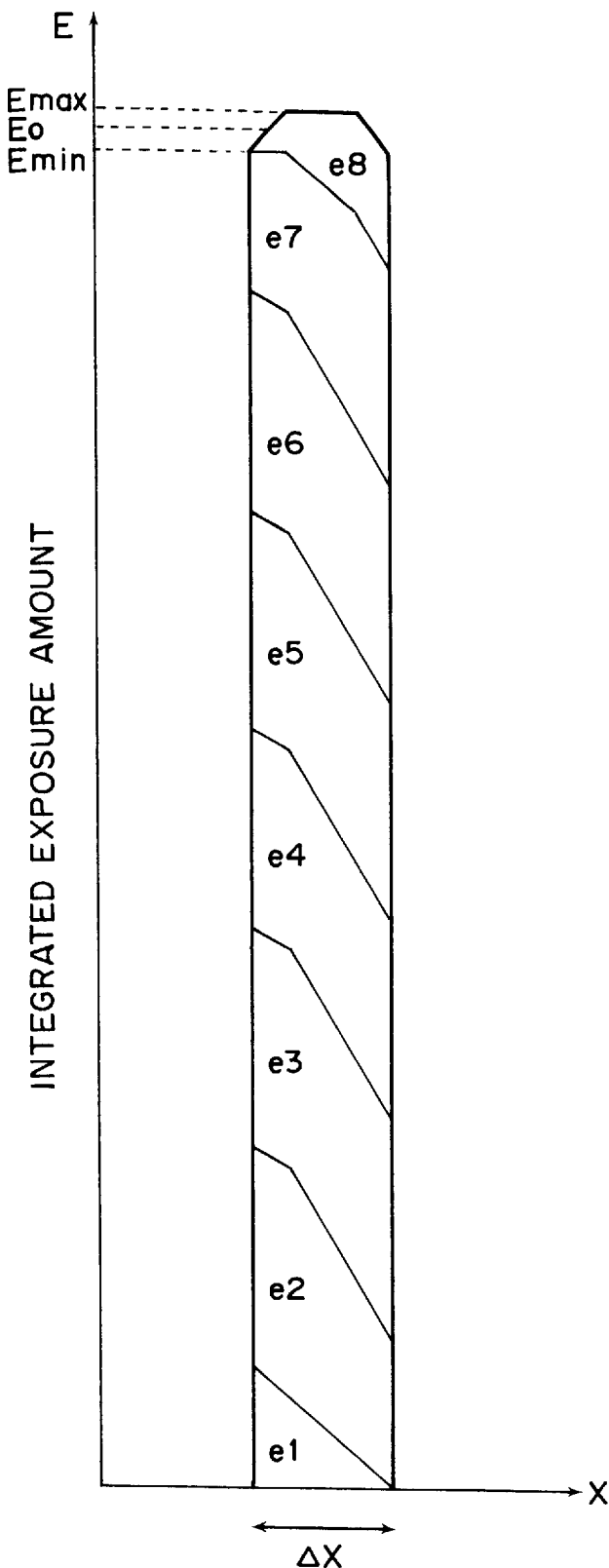
FIG. 4 is a graph for explaining the integrated exposure amount in a zone ΔX.

FIG. 3 illustrates the relation between the displacement $\Delta X$ and the intensity distribution of the pulse light in the scan direction The axis of the abscissa in the drawing corresponds to the X coordinate of the wafer 11, and the axis of the ordinate corresponds to the light intensity. The wafer displaces by $\Delta X$ per pulse. Thus, in a particular zone $\Delta X$ upon the wafer 11, exposures $e_1$–$e_8$ are integrated. FIG. 4 illustrates the integrated exposure amount in this zone $\Delta X$. The axis of the abscissa in the drawing corresponds to the X coordinate of the wafer 11, and the axis of the ordinate corresponds to the integrated exposure amount. In the relation between the pulse light intensity distribution and the displacement as illustrated in FIG. 3, in the zone $\Delta X$, there occurs exposure non-uniformness of $E_{max}$ and $E_{min}$ with reference to the target integration exposure amount $E_0$.

Figure 5:
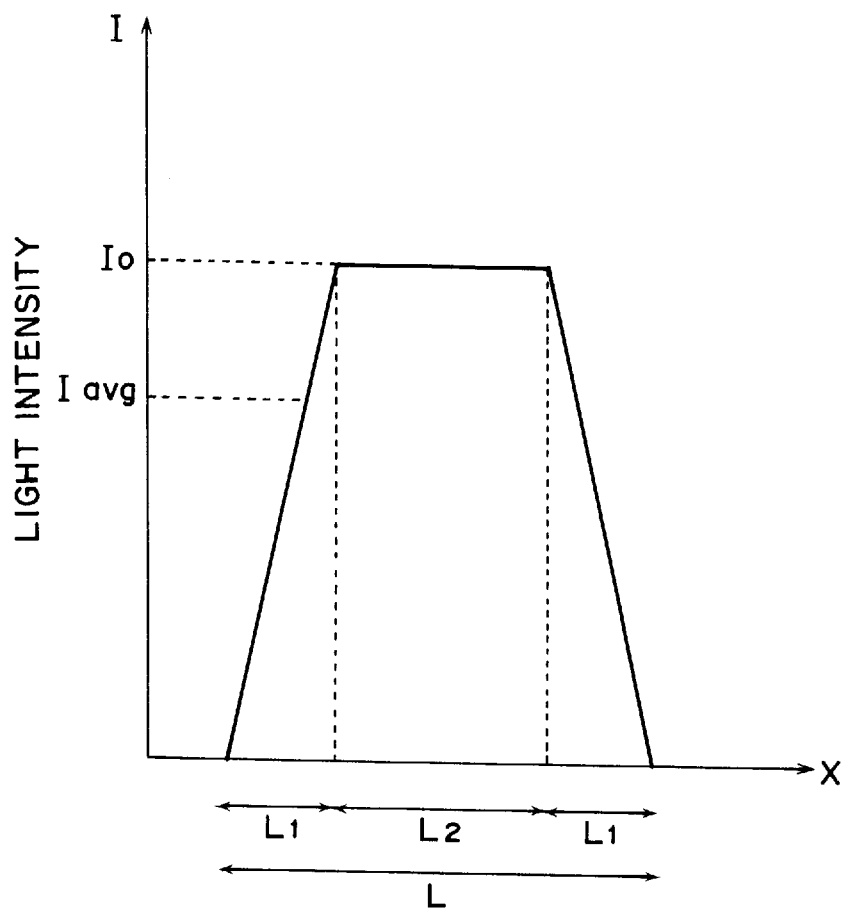
FIG. 5 is a graph for explaining pulse light having an intensity distribution of a symmetrical trapezoidal shape with respect to the scan direction.

Referring now to FIG. 5, a description will be made of the integrated exposure amount by pulse light having an intensity distribution of a symmetrical trapezoidal shape with respect to the scan direction, such as shown in FIG. 3.

If the average light intensity within the exposure width L by one pulse is $I_{avg}$, the target integration exposure amount $E_0$ can be calculated, by using displacement $\Delta X$ of the exposure area, as follows:

$$E_0 = I_{avg} \times L/\Delta X$$

where $L/\Delta X$ corresponds to the number of pulses to a zone $\Delta X$.

In this case, the exposure non-uniformness Y can be determined, by using the displacement $\Delta X$ of the exposure area, the width $L_2$ of a constant light intensity portion and the width $L_1$ of a portion where the light intensity changes slowly, as follows:

$$Y = \{\text{smaller one of } "Y_1 - \sigma \times \Delta X/(2 \times L_1 \times (L_1 + L_2))" \text{ and } "Y_2 - \epsilon \times \Delta X/(2 \times L_1 \times (L_1 + L_2))"\}$$

where $\sigma$: smaller one of the remainder of "$L_1/\Delta X$" and the absolute value of "$\Delta X$–(the remainder)";

$\epsilon$: smaller one of the remainder of "$(L_1 + L_2)/\Delta X$" and the absolute value of "$\Delta X$–(the remainder)".

From the above equation, it is seen that, if the target integration exposure amount $E_0$ changes, regardless of the magnitude of the displacement $\Delta X$ of the exposure region, the intensity distribution of a symmetrical trapezoidal shape with respect to the scan direction, assuring reduced exposure non-uniformness, is the case of n times $L_1$ and $L_2$ (n is an odd number) where $L_1$ is the width of the portion in which the light intensity changes slowly and $L_2$ is the width of the constant light intensity portion.

Figure 6:
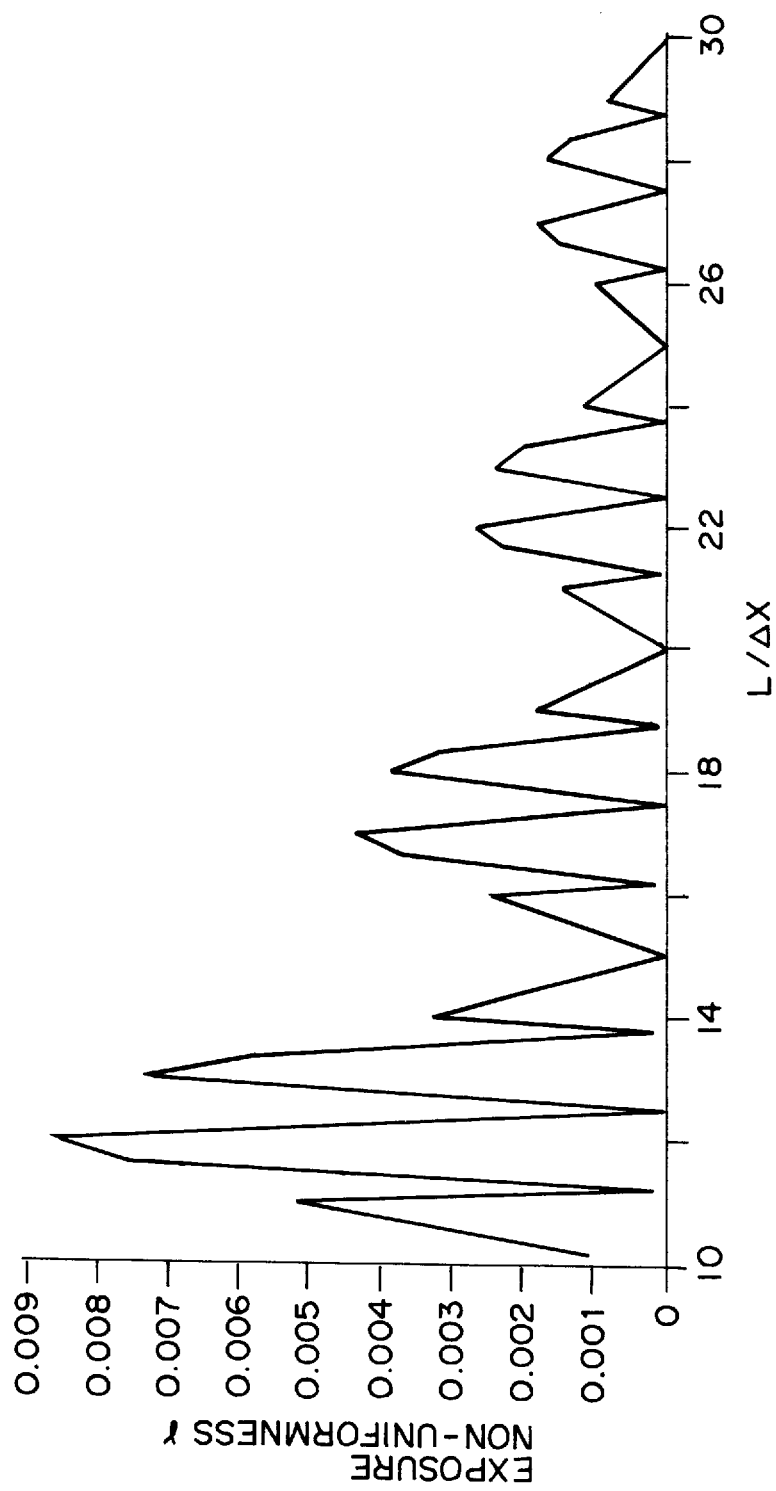
FIG. 6 is a graph for explaining the relation between exposure non-uniformness and the number of received pulses, in a case when the pulse light has an intensity distribution as shown in FIG. 5.

FIG. 6 illustrates the exposure non-uniformness Y to the pulse number $L/\Delta X$ in a case of L=5 mm, $L_1$=1 mm and $L_2$=3 mm, satisfying the above-described condition. In this case, the exposure non-uniformness becomes zero when $L/\Delta X$ is equal to n times 1.25 (n is an integer).

As described, it is seen that, when the pulse light has an intensity distribution of a symmetrical trapezoidal shape with respect to the scan direction, regardless of a change in pulse number $L/\Delta X$, there is a condition that satisfies a target integration exposure amount to a semiconductor substrate and reduces the exposure non-uniformness as well.

When the pulse light has an intensity distribution of a symmetrical shape with respect to the scan direction, the displacement $\Delta X$ of the exposure area that assures exposure non-uniformness=0 can be determined, by using the length $L_2$ of a constant light intensity portion and that $L_1$ of a portion in which the light intensity changes slowly, as follows:

$$\Delta X = (L_1 + L_2)/N_1$$

and $$\Delta X = L_1/N_2$$

where $N_1$ and $N_2$ are natural numbers.

Thus it is seen that, in a case when the pulse light has an intensity distribution of symmetrical trapezoidal shape with respect to the scan direction, the condition free from exposure non-uniformness is that: the sum of the width $L_1$ of the portion in which the light intensity changes slowly and the width $L_2$ in which the light intensity is constant corresponds to n times the displacement $\Delta X$ of the wafer per pulse (n is a natural number); or the width $L_1$ of the portion in which the light intensity changes slowly corresponds to n times the displacement $\Delta X$ of the wafer per pulse (n is a natural number).

Once the intensity distribution of the pulse light in the scan direction is detected in the manner described above, the integrated exposure amount and the exposure non-uniformness can be determined in accordance with the pulse number $L/\Delta X$. By using this relation, the target integration exposure amount and the exposure non-uniformness can be adjusted. This will be explained below.

The exposure non-uniformness Y to the pulse number $L/\Delta X$, in the case where L=5 mm, $L_1$=1 mm and $L_2$=3 mm as that of the FIG. 5 example, is such as illustrated in FIG. 6 as has been described. In this case, the exposure non-uniformness becomes zero when $L/\Delta X$ is equal to n times 1.25 (n is an integer).

Here, if in FIG. 5 the light intensity $I_0$=1.5 mj and $I_{avg}$=1.2 mj and if the target integration exposure amount $E_0$ is 14.4 mj, then $L/\Delta X$ can be determined by using the equation of target integration exposure amount $E_0$ as follows:

$$L/\Delta X = E_0/I_{avg} = 14.4/1.2 = 12.$$

Thus, from FIG. 6, it is seen that the exposure non-uniformness in this case is 0.0085. When the set tolerance to exposure non-uniformness is zero, $L/\Delta X$ may well be equal to 11.25, which is close to 12 and is equal to n times 1.25 (n is an integer), and the light source 1 and/or the variable ND filter 3 may be adjusted to assure the following:

$$I_{avg} = E_0/(L/\Delta X) = 14.1/11.25 = 1.28 (mj).$$

Alternatively, $L/\Delta X$ may be equal to 12.5, and the light source 1 and/or the variable ND filter 3 may be adjusted to provide the following:

$$I_{avg} = E_0/(L/\Delta X) = 14.4/12.5 = 1.152 (mj).$$

Next, a method of reducing the exposure non-uniformness by changing the intensity distribution of pulse light in the scan direction, will be described.

The exposure non-uniformness to the pulse number $L/\Delta X$, in the case where L=5 mm, $L_1$=1 mm and $L_2$=3 mm as of the FIG. 5 example, is such as illustrated in FIG. 6 as has been described. Here, in order to reduce the exposure non-uniformness to zero without changing the condition that L=5 mm and $L/\Delta X$=12, the value $L_1$ that satisfies the following relation may well be determined:

$$\Delta X = (L_1 + L_2)/N_1$$

or $$\Delta X = L_1/N_2$$

Here, $\Delta X$=5/12 and, if $N_2$=3, then $L_1$ is equal to 1.25 mm. The length of $L_1$ can be adjusted by moving the masking blade 6 In the direction of the optical axis and simultaneously by changing the shape of the opening thereof. Thus, a desired length $L_1$ is attainable without changing L. In this case, in order to assure that $I_{avg}=1.2$ mj, the light source 1 and/or the variable ND filter 3 may be adjusted to provide $I_0=1.6$ mj.

As described above, once the intensity distribution of the pulse light with respect to the scan direction is determined, the integrated exposure amount and the exposure non-uniformness can be determined definitely in relation to the pulse number $L/\Delta X$ and thus can be expressed as a function. Thus, by adjusting either the intensity distribution of the pulse light in the scan direction or the pulse number $L/\Delta X$, a target exposure amount to a semiconductor substrate is satisfied and exposure non-uniformness is reduced to a level lower than a tolerance.

As regards the intensity distribution of the pulse light in the scan direction, the shape of a blurred region corresponding to the slant portion of the trapezoidal intensity distribution as described may be one following a curve which is slightly deviated from a straight line.

Figure 7:
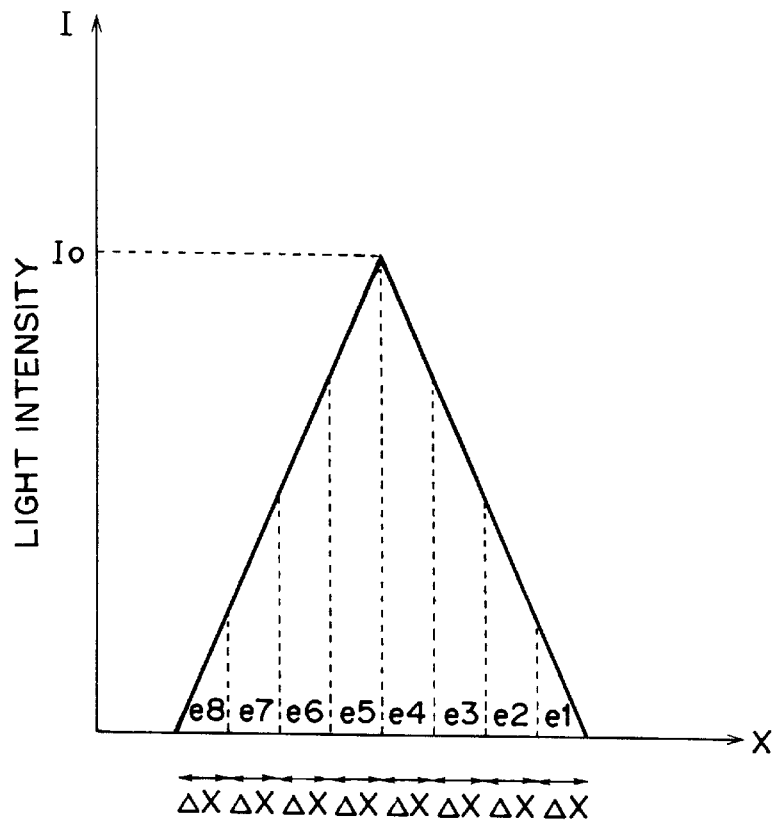
FIG. 7 is a graph for explaining the amount of exposure in relation to displacement, per pulse, of pulse light having an intensity distribution of a symmetrical triangular shape with respect to the scan direction.
Figure 8:
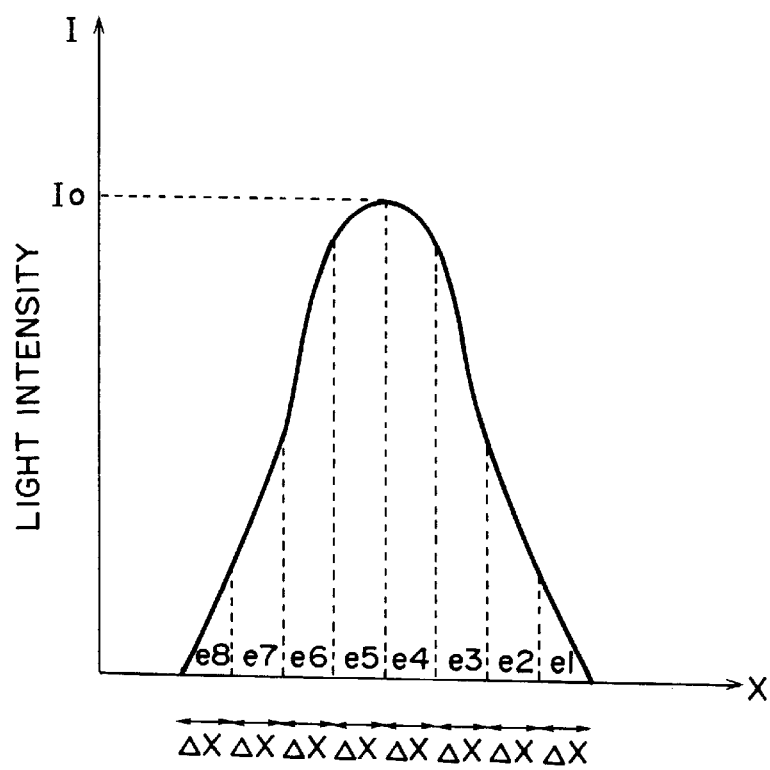
FIG. 8 is a graph for explaining the amount of exposure in relation to displacement, per pulse, of pulse light having an intensity distribution of a symmetrical shape with respect to the scan direction.
Figure 9:
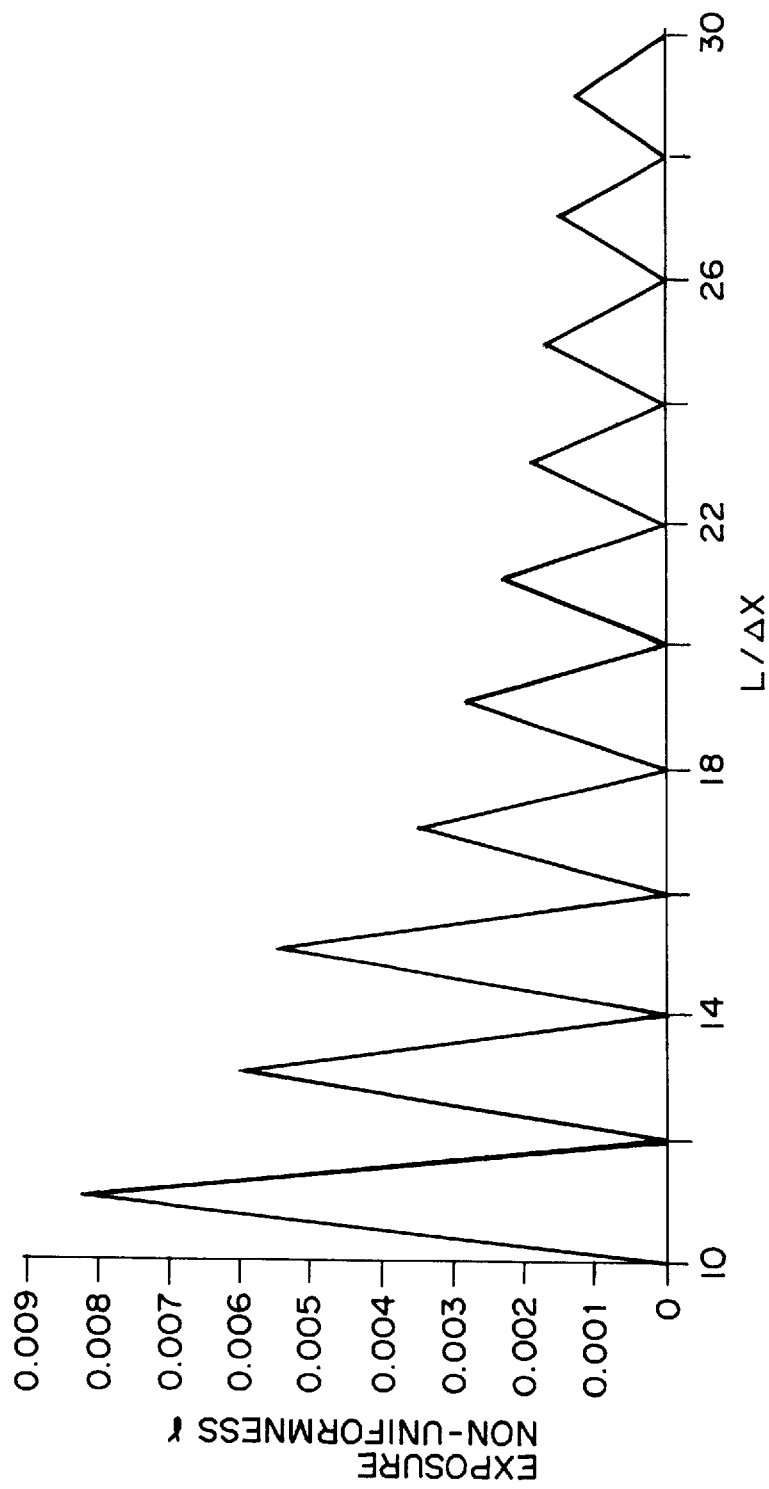
FIG. 9 is a graph for explaining the relation between exposure non-uniformness and the number of received pulses, in a case when the pulse light has an intensity distribution as shown in FIG. 7.
Figure 10:
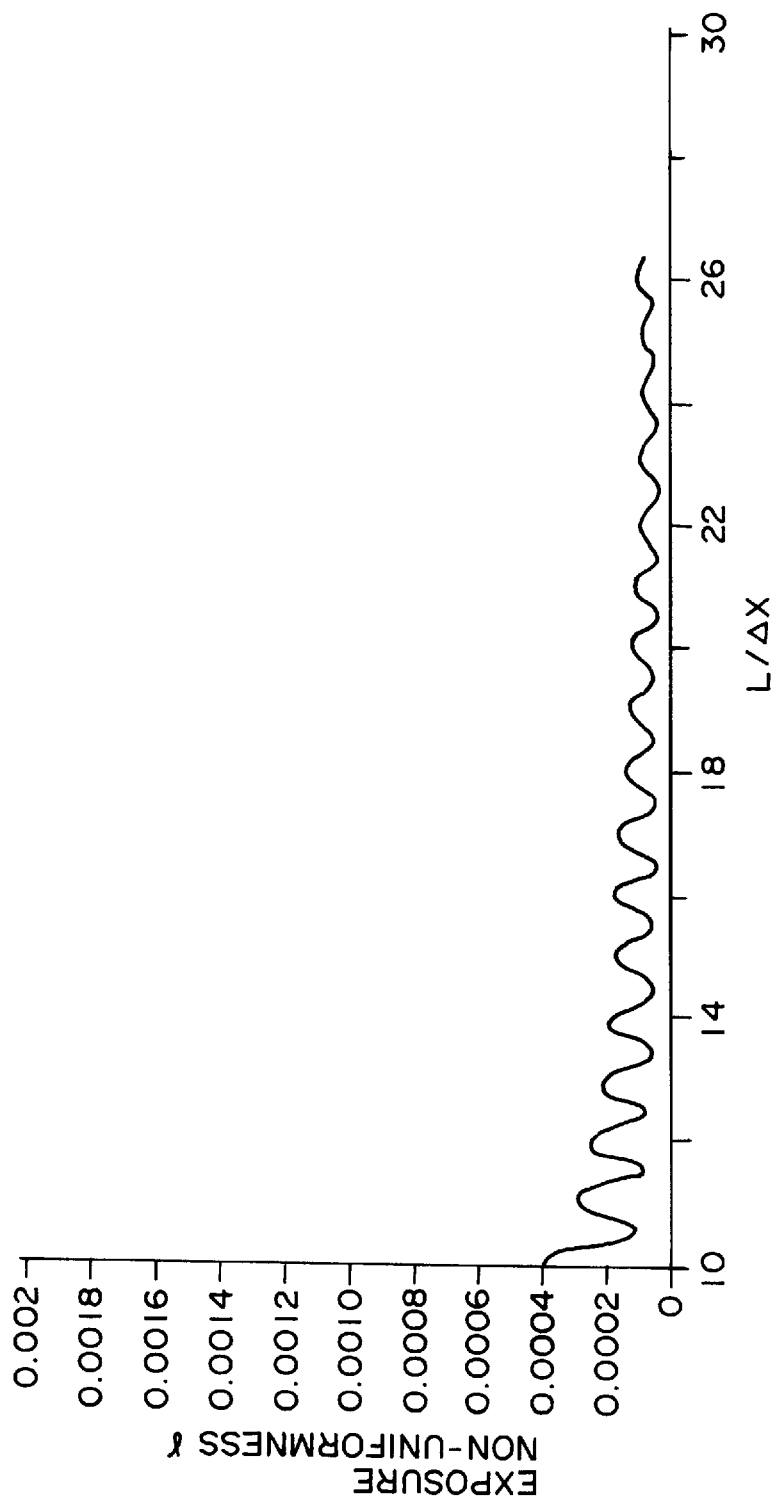
FIG. 10 is a graph for explaining the relation between exposure non-uniformness and the number of received pulses, in a case when the pulse light has an intensity distribution as shown in FIG. 8.

The intensity distribution of the pulse light in the scan direction may be such as shown in FIG. 7 or 8. On these occasions, once the intensity distribution of the pulse light in the scan direction is detected, the integration exposure amount and exposure non-uniformness can be determined definitely in relation to the pulse number and can be expressed as a function. FIG. 9 illustrates the relation between the pulse number and exposure non-uniformness, corresponding to the FIG. 7 case. FIG. 10 illustrates the relation between the pulse number and exposure non-uniformness, corresponding to the FIG. 8 case. It is seen that, regardless of the shape of the intensity distribution of the pulse light in the scan direction, through a similar process as in the case of the trapezoidal intensity distribution described hereinbefore and by measuring the intensity distribution of the pulse light and by detecting the relation between the pulse number and exposure non-uniformness, the condition for wafer displacement per pulse as well as the pulse light intensity distribution in the scan direction can be adjusted to satisfy a target exposure amount to a semiconductor substrate and, additionally, to reduce the exposure non-uniformness to a level lower than a tolerance.

Next, an embodiment of a semiconductor device manufacturing method which uses a projection exposure apparatus such as shown in FIG. 1, will be explained.

Figure 11:
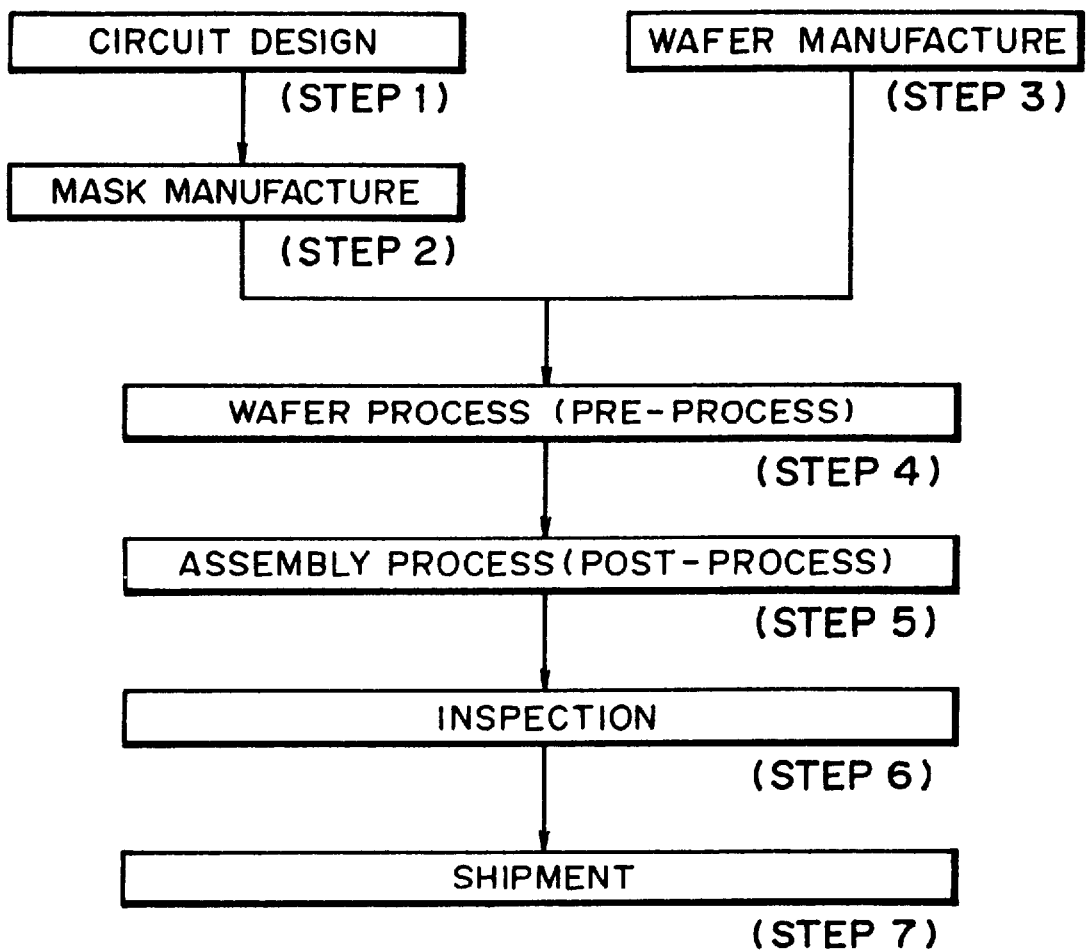
FIG. 11 is a flow chart of semiconductor device manufacturing processes.

FIG. 11 is a flow chart of the sequence of manufacturing a semiconductor device such as a semiconductor chip (e.g., an IC or an LSI), a liquid crystal panel or a CCD, for example Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 12:
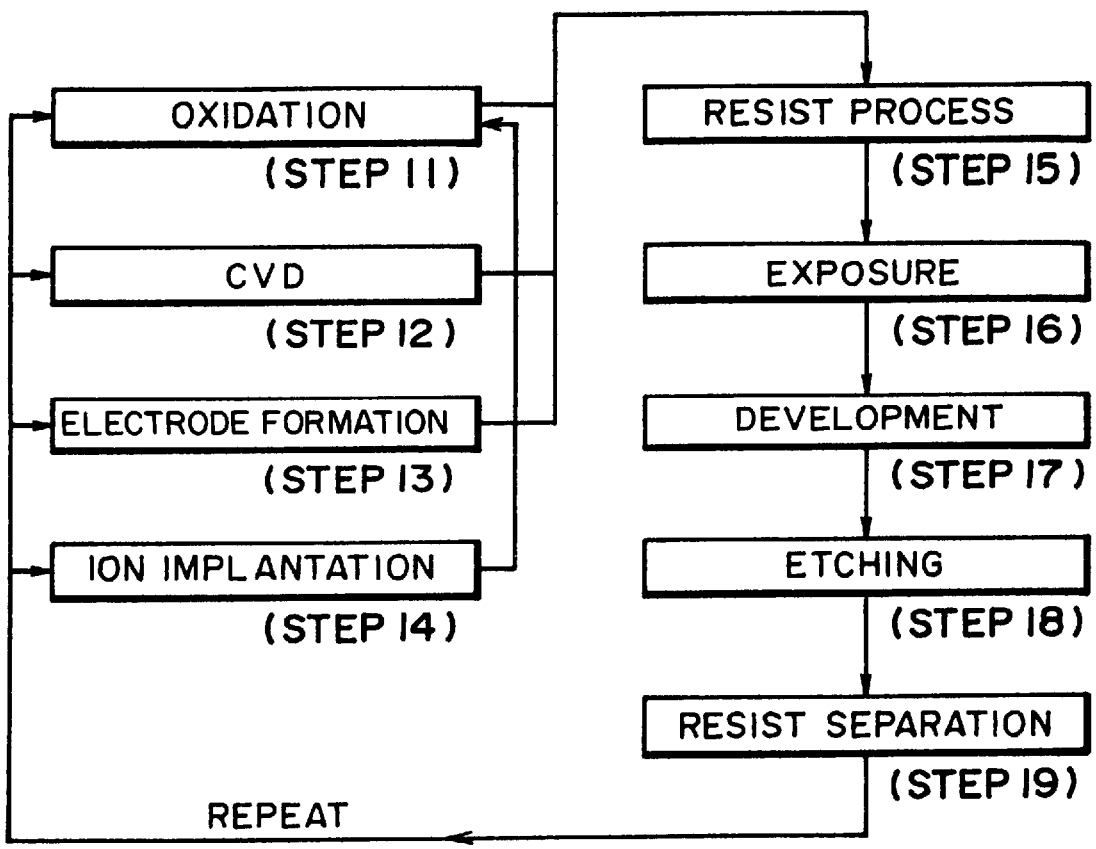
FIG. 12 is a flow chart for explaining details of a wafer process in the sequence of FIG. 11.

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above Step 17 is a developing process for developing the exposed wafer Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the present invention, as described hereinbefore, exposure non-uniformness can be effectively reduced such that a precision device can be produced very accurately.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:

a pulse light source for providing pulse light for scan exposure of a substrate, wherein, for the scan exposure, the substrate is moved relative to an irradiation region to be irradiated with the pulse light from said pulse light source; and adjusting means for detecting, on the basis of an intensity distribution of the pulse light with respect to a substrate movement direction, a relation between (i) the number of light pulses received by an exposure region on the substrate, which exposure region is exposed to the pulse light, during a period in which the exposure region passes the irradiation region, and (ii) exposure non-uniformness on the exposure region, said adjusting means adjusting, on the basis of information related to the detected relation and a desired exposure amount on the exposure region, at least one of the number of light pulses received by the exposure region during the period in which the exposure region passes the irradiation region and the intensity distribution of the pulse light with respect to the substrate movement direction, wherein the intensity distribution of the pulse light with respect to the substrate movement direction has a substantially isosceles trapezoidal shape, and wherein a relation $L_2=(2N-1)\times L_1$ is satisfied, where $L_1$ is a width of a side of a region in the intensity distribution, in which region the intensity in the intensity distribution changes, $L_2$ is a width of a region in the intensity distribution, in which region the intensity is linear, and N is a natural number.

2. An apparatus according to claim 1, wherein said adjusting means controls at least one of a movement speed of the substrate and a pulse emission interval of said pulse light source, to adjust the number of pulses emitted during the period in which the exposure region passes the irradiation region.

3. An apparatus according to claim 1, wherein said adjusting means adjusts a length of a portion of the intensity distribution, in which portion the intensity varies.

4. An apparatus according to claim 1, wherein said pulse light source comprises an excimer laser.

5. A device manufacturing method for manufacturing a device, including a process for exposing a substrate being moved, with pulse light from a pulse light source, said method comprising the steps of:

detecting, on the basis of an intensity distribution of the pulse light with respect to a substrate movement direction, a relation between (i) the number of light pulses received by an exposure region on the substrate, which exposure region is exposed to the pulse light, during a period in which the exposure region passes an irradiation region irradiated with the pulse light from the pulse light source, and (ii) exposure non-uniformness on the exposure region; and adjusting, by use of adjusting means and on the basis of information related to the detected relation and a desired exposure amount on the exposure region, at least one of the number of light pulses received by the exposure region during the period in which the exposure region passes the irradiation region and the intensity distribution of the pulse light with respect to the substrate movement direction, wherein the intensity distribution of the pulse light with respect to the substrate movement direction has a substantially isosceles trapezoidal shape, and wherein a relation $L_2=(2N-1)\times L_1$ is satisfied, where $L_1$ is a width of a side of a region in the intensity distribution, in which region the intensity in the intensity distribution changes, $L_2$ is a width of a region in the intensity distribution, in which region the intensity is linear, and N is a natural number.

6. A method according to claim 5, further comprising controlling, by the adjusting means, at least one of a movement speed of the substrate and a pulse emission interval of the pulse light source, to adjust the number of pulses emitted during the period in which the exposure region passes the irradiation region.

7. A method according to claim 5, further comprising adjusting, by the adjusting means, a length of a portion of the intensity distribution, in which portion the intensity varies.

8. A method according to claim 5, wherein the pulse light source comprises an excimer laser.

* * * * *

UNITED STATES PATENT AND TRADEMARK OFFICE
CERTIFICATE OF CORRECTION

PATENT NO. : 5,846,678

DATED : December 8, 1998

INVENTORS : HIDETOSHI NISHIGORI, ET AL.

It is certified that error appears in the above-identified patent and that said Letters Patent is hereby corrected as shown below:

COLUMN 2:

line 45, "Invention," should read --invention,--; and
    line 62, "water," should read --wafer,--.

COLUMN 3:

line 52, "laser" should read --laser.--.

COLUMN 6:

line 34, "In" should read --in--; and
    line 50, "water" should read --wafer--.

COLUMN 7:

line 1, "direction" should read --direction.--.

COLUMN 8:

line 25, "as" should read --as that--;
    line 54, "as" should read --as that--; and
    line 64, "$\Delta X=L_1/N_2$" should read --$\Delta X=L_1/N_2.$--.

UNITED STATES PATENT AND TRADEMARK OFFICE
CERTIFICATE OF CORRECTION

PATENT NO. : 5,846,678

DATED : December 8, 1998

INVENTORS : HIDETOSHI NISHIGORI, ET AL.

It is certified that error appears in the above-identified patent and that said Letters Patent is hereby corrected as shown below:

COLUMN 9:

line 1, "In" should read --in--; and
    line 49, "example" should read --example.--.

COLUMN 10:

line 9, "above" should read --above.--; and
    line 10, "wafer" should read --wafer.--.

Signed and Sealed this

Seventeenth Day of August, 1999

Attest:

Q. TODD DICKINSON

*Attesting Officer*      *Acting Commissioner of Patents and Trademarks*